United States Patent [19]

Gallager

[11] Patent Number: 4,586,182
[45] Date of Patent: Apr. 29, 1986

[54] SOURCE CODED MODULATION SYSTEM
[75] Inventor: Robert G. Gallager, Lexington, Mass.
[73] Assignee: Codex Corporation, Mansfield, Mass.
[21] Appl. No.: 577,045
[22] Filed: Feb. 6, 1984
[51] Int. Cl.[4] .................. H04L 5/12; G06F 11/10
[52] U.S. Cl. .................................. 371/30; 371/43; 375/25
[58] Field of Search .............. 371/30, 43, 44, 45; 375/27, 34, 39, 25

[56] References Cited

U.S. PATENT DOCUMENTS

| 4,077,021 | 2/1978 | Csajka et al. | 332/9 R |
| 4,483,012 | 11/1984 | Wei | 371/43 X |
| 4,493,082 | 1/1985 | Cumberton | 371/43 |
| 4,520,490 | 5/1985 | Wei | 371/43 X |

FOREIGN PATENT DOCUMENTS 352207 2/1982 Canada .

OTHER PUBLICATIONS

Ungerboeck, "Channel Coding with Multilevel/Phase Signals", IEEE Transactions of Information Theory, vol. IT-28, No. 1, Jan. 1982, pp. 55-67.

Primary Examiner—Charles E. Atkinson

[57] ABSTRACT

Apparatus for sending bits of information over a band-limited channel by modulating a carrier in accordance with a sequence of signal points drawn from a constellation of available signal points, in which the apparatus includes circuitry for accumulating groups of the information bits for encoding into the signal points, different groups having different numbers of information bits from a primary data source, and an encoder for encoding at least the bits of each said group into at least one signal point drawn from the constellation, the encoder being arranged to draw different available signal points with different probabilities.

27 Claims, 11 Drawing Figures

FIG. 2

BIT COMBINATION

```
0000000 ⎫
0000001 ⎪
   ⋮      ⎬ LAYER L₀
0111111 ⎭

1000000 ⎫
   ⋮      ⎬ LAYER L₁
1011111 ⎭

1100000 ⎫
   ⋮      ⎬ LAYER L₂
1111111 ⎭
```

FIG. 5

| MODULATION INTERVAL | BITS LOADED INTO BUFFER | MINIMUM NUMBER OF BITS NEEDED IN BUFFER BEFORE NEXT MODULATION INTERVAL | MINIMUM NUMBER OF BITS IN THE BUFFER AT THE END OF THE MODULATION INTERVAL |
|---|---|---|---|
| 1 | 8 | 2 | 0 |
| 2 | 8 | 2 | 1 |
| 3 | 8 | 3 | 1 |
| 4 | 8 | 3 | 2 |
| 5 | 8 | 4 | 2 |
| 6 | 8 | 4 | 3 |
| 7 | 8 | 5 | 3 |
| 8 | 8 | 5 | 4 |
| 9 | 8 | 6 | 4 |
| 10 | 8 | 6 | 5 |
| 11 | 8 | 7 | 5 |
| 12 | 8 | 7 | 6 |
| 13 | 8 | 8 | 6 |
| 14 | 8 | 8 | 7 |
| 15 | 8 | 9 | 7 |
| 16 | 0 | 1 | 0 |

FIG. 6

| MODULATION INTERVAL | BITS UNLOADED FROM BUFFER | DESIRED MAXIMUM NUMBER OF BITS IN BUFFER AT END OF INTERVAL |
|---|---|---|
| 1 | 8 | 38 |
| 2 | 8 | 38 |
| 3 | 8 | 37 |
| 4 | 8 | 37 |
| 5 | 8 | 36 |
| 6 | 0 | 44 |
| 7 | 8 | 43 |
| 8 | 8 | 43 |
| 9 | 8 | 42 |
| 10 | 8 | 42 |
| 11 | 8 | 41 |
| 12 | 8 | 41 |
| 13 | 8 | 40 |
| 14 | 8 | 40 |
| 15 | 8 | 39 |
| 16 | 8 | 39 |

SOURCE CODED MODULATION SYSTEM

BACKGROUND OF THE INVENTION

This invention relates to systems for sending bits of information from a data source over a band-limited channel by modulating a carrier in accordance with a sequence of signal points drawn from a constellation of available signal points on the basis of groups of the information bits.

Csajka et all., U.S. Pat. No. 4,077,021, and in Ungerboeck, "Channel Coding with Multilevel/Phase Signals", IEEE Transactions on Information Theory, Vol. IT-28, No. 1, January, 1982, incorporated herein by reference, disclose systems in which each group of information bits is expanded by adding one bit of coding data (used at the receiver to aid in the decoding process) and each expanded group is encoded as one modulation signal point. All groups have the same number of information bits, and the encoding is arranged so that signal points on the constellation are equally likely to be drawn.

Forney, U.S. patent application Ser. No. 439,740 (filed Oct. 8, 1982), discloses systems in which the coding data is added to only some of the groups, and the constellation is arranged so that signal points closer to the origin have a greater probability of being drawn than signal points farther from the origin.

Canadian patent application Ser. No. 352,207 (filed Feb. 25, 1982), discloses a system in which the information bits for each group are accumulated both from primary and secondary data sources. Different groups all include the same number of primary source bits but may or may not have an additional bit from the secondary source. Groups having fewer total bits are encoded as signal points nearer to the origin; groups with more total bits are encoded as signal points farther from the origin. Points nearer the origin are more likely to be selected than points farther from the origin.

Modems typically are fed input bits from a single synchronous primary data source (or multiplexed group of data sources), and in some cases also draw further bits from secondary data sources, including asynchronous sources of control bits.

SUMMARY OF THE INVENTION

In general, the invention features in one aspect apparatus for sending bits of information over a band-limited channel by modulating a carrier in accordance with a sequence of signal points drawn from a constellation of available signal points, in which the apparatus includes circuitry for accumulating groups of the information bits for encoding into the signal points, different groups having different numbers of information bits from a primary data source, and an encoder for encoding at least the bits of each said group into at least one signal point drawn from the constellation, the encoder being arranged to draw different available signal points with different probabilities.

In preferred embodiments, there is a buffer for accepting the information bits from the primary source in a predetermined order, and delivering those bits in the same predetermined order; the circuitry also accumulates further bits, including bits of coding data used at a receiver to aid in determining which sequence of signal points was sent; coding data is added to every group; the circuitry is arranged to accumulate different aggregate numbers of information bits and further bits in different said groups; there is a secondary source of additional bits and the circuitry is arranged to accumulate information bits from the data source for inclusion in each group, and to accumulate at least one additional bit from the secondary source for inclusion in at least some of the groups; signal points corresponding to groups having fewer numbers of bits have a higher probability of being sent than at least some signal points corresponding to groups having greater numbers of bits; at least some additional bits accumulated from the secondary source comprise control information for use by the receiver; and the circuitry is arranged to accumulate from the secondary source bits having prespecified values when bits are needed from the secondary source and the secondary source has no non-arbitrary bits to deliver.

Further, in preferred embodiments, the different probabilities have a non-uniform distribution as a function of distance from the origin in the constellation; in particular, the function is a step-function represented by a plurality of concentric regions of signal points on the constellation, each region being centered on the origin, the probability of selection of each signal point in one region being the same as for any other signal point in the region but smaller than for any signal point in another region which is farther from the origin than the one region; there are three regions and the probability of selecting a particular signal point from each region is half as great as the probability of selecting a particular signal point from the next closer region to the origin; the respective probabilities of the signal point selections being in the three regions are $\frac{1}{2}$, $\frac{1}{4}$, and $\frac{1}{4}$; some groups include at least one additional bit, the signal points of each region correspond to groups having a particular number of bits, and the groups corresponding to regions farther from the origin have more bits than groups corresponding to regions nearer the origin; the groups corresponding to the regions respectively each have 7, 8, and 9 bits; the receiver is connected to use the region in which a received signal falls to determine the number of bits in each group; and the groups which have the arbitrary valued bits are encoded as signal points nearer the origin than the signal point into which at least one group which has no arbitrary valued bits is encoded.

Further, in preferred embodiments, there is a first-in, first-out buffer arranged to accumulate the information bits at an average input rate, and to deliver bits at an average output rate to the encoder, the average input rate being lower than the average output rate; the average input rate is a non-integral number of bits per modulation interval, preferably $7\frac{1}{2}$ bits per modulation interval, and the average output rate is $7\frac{3}{4}$ bits per modulation interval; the buffer has a succession of buffer cells arranged from an input end to an output end of the buffer, and the buffer is arranged to accumulate the additional bits directly into buffer cells located at the output end of the buffer; the number of bits in the group delivered by the buffer in a given modulation interval determines the region from which the signal point for that group is drawn; and the buffer includes buffer control circuitry for assuring that a predetermined minimum number of bits are held in the buffer immediately before each modulation interval begins; and the buffer control circuitry is connected so that no fewer than a minimum permissible number of bits can be in the buffer after the buffer delivers the bits in each modulation interval, and the average input and output rates are selected to assure that no more than the minimum permissible number is in the buffer after the delivery in enough modulation intervals so that synchronization errors at the receiver will be corrected on average within a predetermined acceptable number of modulation intervals.

In another aspect, the invention features apparatus for sending bits of information over a band-limited channel by modulating a carrier in accordance with a sequence of signal points, the encoder being arranged to draw each signal point on the basis of a group of information bits, different groups corresponding to signal points at different distances from the origin of said constellation, the apparatus including a secondary source for normally providing additional bits to the encoder, the encoder being arranged so that each signal point selected on the basis of said additional bits from the secondary source has predetermined relative probabilities of being in an inner collection of the signal points (nearer the origin) compared with being in an outer collection of signal points farther from the origin, and circuitry for providing additional bits to the encoder when the secondary source has no additional bits to provide, the additional bits provided by this circuitry having an arbitrary value pre-selected so that each signal point drawn on the basis of such an arbitrary valued additional bit has a greater relative probability of being in the inner collection versus being in the outer collection than the predetermined relative probabilities with respect to an additional bit provided by the secondary source.

In preferred embodiments, all signal points drawn on the basis of an additional bit having the arbitrary value are in the inner collection.

The apparatus gives a coding gain and is relatively simple to implement. Preferred embodiments are capable of handling a non-integral number of bits per modulation interval from the data source, provide a secondary channel, and have an acceptably short recovery time from synchronization errors at the receiver.

Other advantages and features will become apparent from the following description of the preferred embodiment and from the claims.

DESCRIPTION OF THE PREFERRED EMBODIMENT

We first briefly describe the drawings.

Drawings

FIG. 2 is a diagram of a signal point constellation showing the subset organization of the signal points.

FIG. 5 is a table showing the layers of possible seven-bit combinations used by the buffer control of FIG. 4.

FIG. 6 is a table showing buffer length information for the buffer of FIG. 4. for successive modulation intervals.

STRUCTURE AND OPERATION

Figure 1:
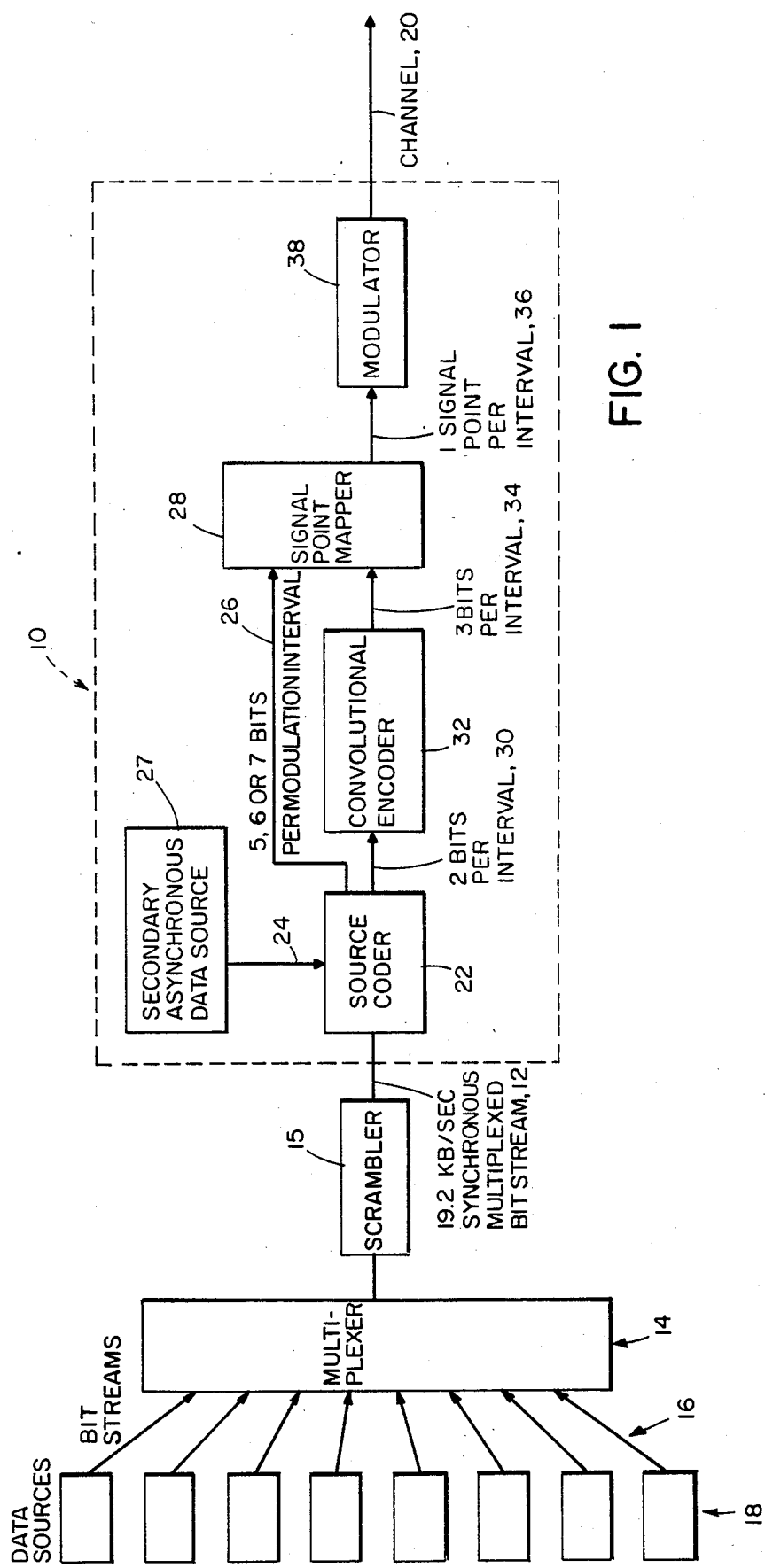
FIG. 1 is a block diagram of data sources and a transmitter.

Referring to FIG. 1, modem transmitter 10 is connected to line 12 to sample (in a predetermined sequence of bit time intervals and in a predetermined order) a synchronous multiplexed stream of information bits appearing (after passage through scrambler 15) at the rate of 19.2 kilobits per second from multiplexer 14 (a primary data source of information bits) which is connected to lines 16 to take information bits one at a time in turn from several (e.g., eight) different data sources 18, for example terminals needing to transmit information. The output of transmitter 10 is connected to channel 20 for sending a carrier modulated in accordance with a succession of two-dimensional signal points delivered from transmitter 10 at a baud rate of 2560 (equivalent to an average of $7\frac{1}{2}$ bits per modulation interval).

Transmitter 10 has a source coder 22 which takes sequences of bits from line 12. Source coder 22 is also connected by line 24 to relatively slow secondary asynchronous data source 27 from which coder 22 may or may not (as explained below) accept one or more additional bits in a particular modulation interval. The additional bits from the secondary source 27 represent control information which is used at the receiver end of channel 20.

Source coder 22 has two outputs connected respectively by line 26 to signal point mapper 28 and by line 30 to convolutional encoder 32 whose output is in turn connected by line 34 to signal point mapper 28. In each modulation interval, lines 26 and 30 respectively carry sequences of bits which are derived from the bits received over lines 12, 24 in a way governed by source coder 22.

Convolutional encoder 32 is a rate $\frac{2}{3}$ encoder which delivers three output bits for two input bits received in a modulation interval, the additional bit comprising coding data which is used at the receiver to aid in deciding which signal points were sent.

Signal point mapper 28 maps the bit combination (i.e., group of bits) received over lines 26, 34 in a given modulation interval into a signal point on a two-dimensional signal point constellation. Line 36 carries the signal point to modulator 38 which uses it to modulate the carrier sent over channel 20.

Figure 2:
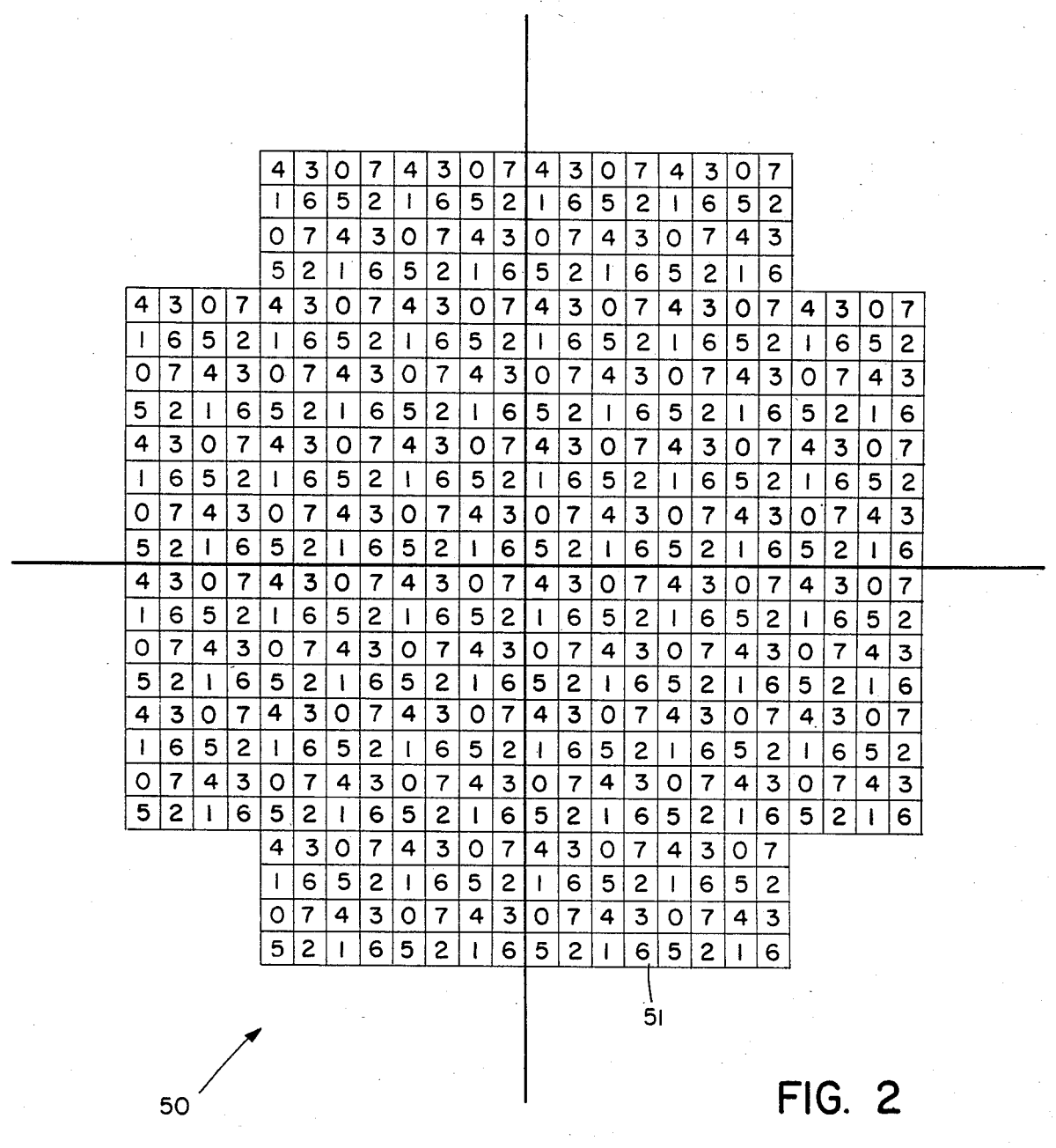

Referring to FIG. 2, the signal point constellation 50 has 512 signal points 51 partitioned into eight equal-sized subsets. The subset to which each signal point belongs is indicated in FIG. 2. The subsets form two classes, one comprised of even-numbered subsets and the other comprised of odd-numbered subsets. The subsets are arranged so that the minimum squared distance between two signal points in the same subset is greater than the minimum squared distance between two signal points in different subsets within the same class, which is in turn greater than the minimum squared distance between two signal points in different classes.

Figures 3, 4:
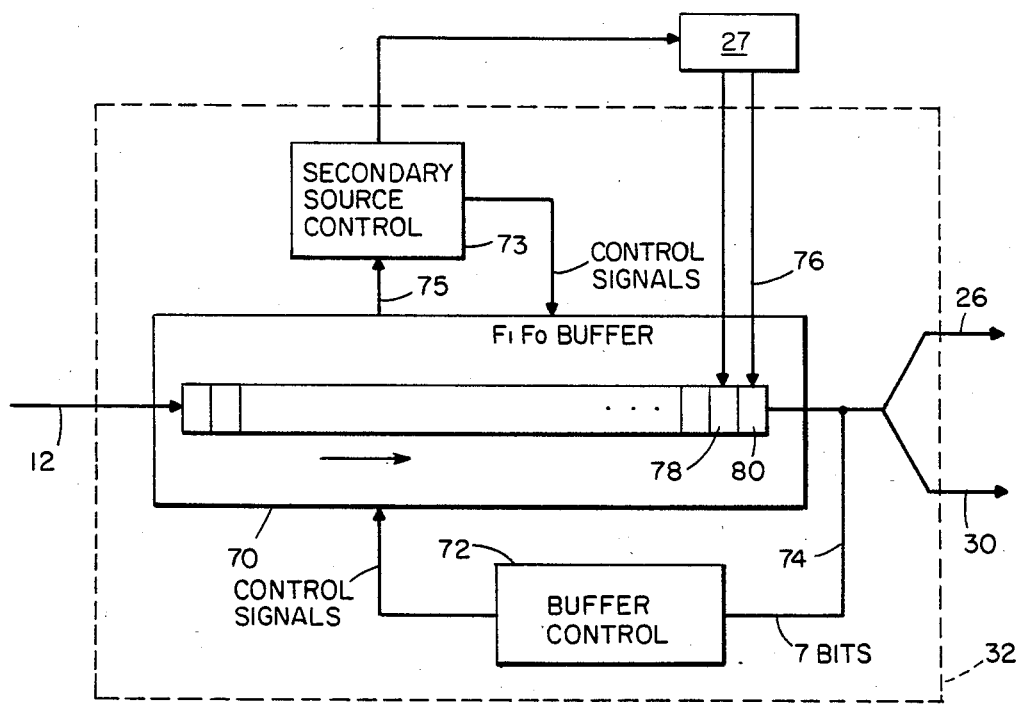
FIG. 3 is one representative quadrant of the constellation of FIG. 2 showing the concentric regions and the numerical designations for the signal points.
FIG. 4 is a block diagram of the source coder of FIG. 1.

Referring to FIG. 3, which shows one representative quadrant of the constellation, the signal points in the constellation are also divided into three concentric regions 52, 54, 56, defined by boundaries 58, 60, 62. Inner region 52 has 128 inner signal points, middle region 54 has 128 middle signal points, and outer region 56 has 256 outer signal points.

Referring to FIG. 4, source coder 22 includes a first-in, first-out buffer 70 having 41 buffer cells for holding 41 bits. The input end of buffer 70 is connected to accept information bits over line 12 in the predetermined order in which they were sampled, and the output end is connected to feed bits over lines 26, 30 (including the information bits in the same predetermined order), in each case under command from buffer control 72, which has an input connected by line 74 to buffer 70.

Secondary source 27 is connected by lines 76 to the final cells 78, 80 of buffer 70 in such a way that, under command from a secondary source control 73, the additional bits can be forced into cells 78, 80 ahead of bits already in buffer 70. Secondary source control 73 is connected to buffer 70 by line 75 over which it can determine the number of bits in buffer 70 at a given time.

Source coder 22 has a cycle of operation which extends for sixteen modulation intervals, after which the cycle repeats. In each of the first fifteen modulation intervals, eight bits are loaded over line 12 into buffer 70. In the sixteenth interval, no bits are loaded over line 12. Thus, buffer 70 accepts on average $$\frac{8 \times 15}{16} = 7.5$$

bits per interval over line 12. In each modulation interval in which bits are accepted over line 20, they are accepted in a pre-scheduled order and in a sequence of pre-scheduled time intervals, each corresponding to one of the bits and governed by buffer control 72.

Also, in each of the sixteen modulation intervals buffer 70 feeds a group of bits consisting of two bits over line 30 and 5, 6, or 7 bits over line 26. The choice of the number of bits to be fed over line 26 is made by buffer control 72 (in a manner described below). Note that the bits received by buffer 70 over line 12 are received in a predetermined order and those bits are fed out from buffer 70 in the same predetermined order.

At the end of some modulation intervals, the number of bits both in buffer 70 and about to enter buffer 70 from line 12 may be fewer than the number of bits required to be fed over lines 26, 30 in the next modulation interval. The needed additional bits are accepted before that next modulation interval from secondary source 27 under control of secondary source control 73 (in a manner described below). Also, since no bits are drawn from line 12 in the sixteenth interval, it is necessary to build up a stockpile of bits in buffer 70 during the first fifteen intervals so that in the sixteenth interval, the needs of lines 26, 30 can be met. This stockpiling is also accomplished both by the bits accepted from line 12 and those accepted from secondary source 26 under control of secondary source control 73.

In the first modulation interval, the buffer accepts eight bits over line 12 and loads them into the eight cells to the left of cell 80 (cell 80 contains an initial bit loaded from secondary source 27 just before the first modulation interval). Next, seven bits are fed over line 74 to buffer control 72, which examines them for the purpose of determining whether a group of 7, 8, or 9 bits (including the same seven bits just sent to control 72) will be unloaded from buffer 70 onto lines 26 and 30. That determination is made as follows.

Referring to FIG. 5, all of the possible combinations of the seven bits delivered to buffer control 72 are divided into three layers: $L_0$, $L_1$, and $L_2$ where $L_0$ includes all 64 combinations from 0000000 to 0111111, $L_1$ all 32 combinations from 1000000 to 1011111, and $L_2$ all 32 combinations from 1100000 to 1111111. Other assignments of bits to layers, in which more than simply the leading bits specify the layer, are also possible.

Buffer control 72 finds which layer contains the particular seven-bit combination received over line 74, and commands buffer 70 to unload an additional 0, 1, or 2 bits over line 26 depending on whether the 7-bit combination is respectively in layer $L_0$, $L_1$, or $L_2$.

After unloading the appropriate number of bits, buffer 70 contains either 0, 1, or 2 bits in the most significant bit cells 78, 80, depending on how many bits were unloaded. Secondary source control 73 must then make certain that enough bits are in buffer 70 both to satisfy the requirements of the next (in this case the second) modulation interval and to begin the stockpiling of bits. A similar determination must also be made after each subsequent modulation interval.

FIG. 6 is a table showing the minimum number of bits needed in the buffer at the beginning of each of the sixteen modulation intervals, and the minimum number which (by virtue of how the buffer is controlled) could properly have been in the buffer at the end of the prior interval. For example, at the end of the tenth modulation interval the buffer requires six bits before proceeding to the eleventh modulation interval, and must already contain at least five bits before any bits are added from secondary source 27.

At the end of each modulation interval, secondary source control 73 determines over line 75 how many bits are in buffer 70, and compares the number with the number in the third column of FIG. 6. The number of bits actually in the buffer at that time may be at least the required number (in which case no bits need be added) or may be less than the required number. If less, the number will not be fewer than the number listed in the fourth column of FIG. 6 (because of the stockpiling), so that the number of bits which must be added will be either 1 or 2. Those needed additional bits are accepted from secondary source 27 and forced into cell 80 (if one bit) or cells 78, 80 (if two bits) ahead of any bits then in buffer 70, under control of secondary source control 73.

At the end of the sixteenth modulation interval, if buffer 70 contains no bits, a bit is entered from secondary source 27 into cell 80 in preparation for the start of a new sixteen-interval cycle which begins in the next modulation interval. This is reflected in the last line of FIG. 6.

Thus, the number of bits in the buffer can fluctuate from interval to interval but never falls more than two bits shy of the number needed in the next interval, which are then made up from secondary source 27.

Because secondary source 27 is a relatively slow asynchronous source, it may happen that just when buffer 70 needs bits from source 27, none are available. In that case arbitrary "0" bits (i.e., additional bits having an arbitrary pre-selected value) are simply substituted into buffer 70, a fact which (as explained below) provides a further coding gain.

Figure 7:
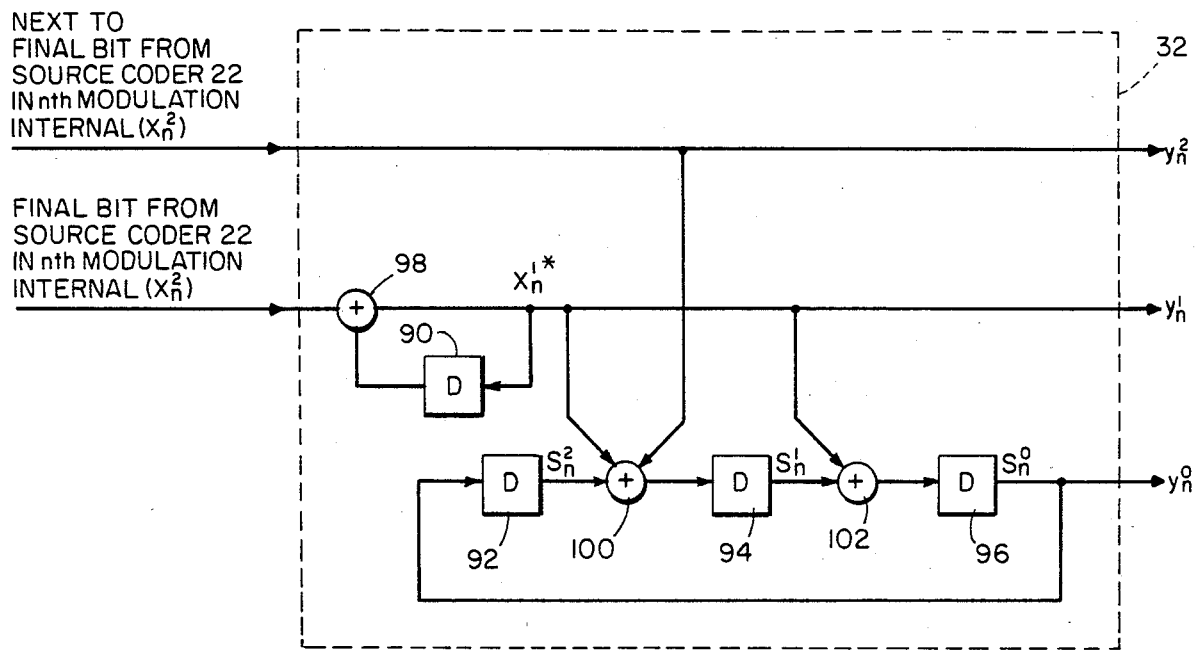
FIG. 7 is a block diagram of the convolutional encoder of FIG. 1.

Referring to FIG. 7, convolutional encoder 32 is a rate $\frac{2}{3}$ encoder which produces three output bits ($Y_n^0$, $Y_n^1$, $Y_n^2$) for each two input bits ($x_n^1$, $x_n^2$), which are the final and next-to-final bits received in the nth modulation interval.

Encoder 32 includes delay elements 90, 92, 94, 96 and modulo two adders 98, 100, 102 which implement the following relationships:

$$y_n^2 = x_n^2$$
$$y_n^1 = x_n^1 \oplus x_{n-1}^1$$
$$y_n^0 = s_n^0$$

where $s_n^0$ is determined in accordance with the following state transition equations for encoder 32:

$$s_n^0 = s_n^1 \oplus [x_n^1 \oplus x_{n-1}^1]$$
$$s_n^1 = s_n^2 \oplus [x_n^1 \oplus x_{n-1}^1] \oplus x_n^2$$
$$s_n^2 = s_n^0$$

Thus encoder 32 is an 8-state device whose state in modulation interval n can be represented by the three-bit combination $s_n^2 s_n^1 s_n^0$. The output bit $Y_n^0$ carries coding data, i.e., information about the past sequence of states occupied by encoder 32. Encoder 32 could have more than eight states to achieve greater coding gains, but at increased complexity of implementation. The coding data is used at the receiver to determine the maximum likelihood sequence of encoder states to aid in decoding the received signals.

Referring again to FIG. 1, signal point mapper 28 receives a group of 8, 9, or 10 bits (all but one of which are information bits, that one being coding data) in each modulation interval over lines 26, 34, and maps them into a single signal point in the constellation of FIGS. 2, 3, as follows.

Referring again to FIG. 5, each bit combination in layer $L_0$ has a 0 as its left-most bit, each bit combination in layer $L_1$ has 10 as its left-most two bits, and each bit combination in layer $L_2$ has 11 as its left-most two bits. Given that 0, 1, and 2 bits have been added respectively to the $L_0$, $L_1$, and $L_2$ bit combinations, and a further bit has been added by convolutional encoder 32, the bit groups received by mapper 28 will take one of the following three forms:

| (Layer $L_0$) | 8 bits  | 0xxxxsss  |
| (Layer $L_1$) | 9 bits  | 10xxxxsss |
| (Layer $L_2$) | 10 bits | 11xxxxsss | where the three s bits correspond to the output of convolutional encoder 32, and the 0 and 1 bits correspond to the left-most bits for the respective layers.

The first rule for selecting a signal point is that eight-bit groups (i.e., those beginning with "0") are mapped into inner region signal points, nine bit groups (i.e., those beginning with 10) into middle region signal points, and ten-bit groups (i.e., those beginning with 11) into outer region signal points.

The three s bits specify the subsets (FIG. 2) from which the signal point will be selected. This leaves the 4 x bits (in the case of inner region and middle region points) and 5 x bits (in the case of outer region points) for specifying which particular signal point from the chosen region and subset will be picked.

Referring again to FIG. 3, the decimal value shown in each signal point position is equivalent to the sequence of all bits in the corresponding group, excluding the s bits. The same pattern is repeated in the other quadrants simply by rotation about the origin of the pattern of FIG. 3.

Within a particular quadrant and a particular region there are twice as many points ($2^{n+1}$) as can be specified by the available number (n) of x bits so that two points in each such quadrant of such a region must be assigned to the same bit group (called a multiple-point group).

It is possible to use the same x-bit assignments in all quadrants because the subset assignments differ from quadrant to quadrant for all multiples of 90° rotations of the constellation (FIG. 2). Because the signal points in the family (family A) of low numbered subsets (0, 1, 2, and 3) will translate into other signal points within the same family when the constellation is rotated by multiples of 90° (and the same is true of points in the family (family B) of high numbered subsets (4, 5, 6, and 7), by assigning each x-bit combination to one signal point from family A and to one from family B, those two-signal points and the corresponding six points in the other three quadrants will be from different subsets and thus distinguishable.

Referring again to FIG. 3, one such assignment of bit groups to signal points is shown. Others are possible provided that the two signal points in each quadrant of each region to which a given bit group is assigned are from different families. Note that each region must have equal numbers of family A and family B points.

Since the region from which each signal point is drawn is determined by the number of input bits to mapper 28, that number of input bits depends on the layer $L_0$, $L_1$, or $L_2$ into which the seven-bit string used by buffer control 72 fell, and the probabilities of the layer being $L_0$, $L_1$, or $L_2$ are respectively $\frac{1}{2}$, $\frac{1}{4}$ and $\frac{1}{4}$.

Therefore the probability of being in the inner region is $\frac{1}{2}$, or of being in either the middle region or the outer region is $\frac{1}{4}$ in each case. Since there are 128 inner region points, the probability of picking a given inner region point is $1/128 \times \frac{1}{2} = 1/256$. Similarly the probability of picking a particular middle region point is $1/128 \times \frac{1}{4} = 1/512$, and of picking a particular outer region point is $1/256 \times \frac{1}{4} = 1/1024$.

Thus, the operation of source coder 22 produces a non-uniform distribution of the probability of picking a given signal point as a function of distance from the origin. Because points closer to the origin require less energy to send, less energy on average is required than for a system in which there is a uniform probability distribution.

The transmitter maps different numbers of bits (7, 8, or 9 excluding the coding bit) in different modulation intervals into one signal point per interval, so that some signal points carry more information than others. The signal points carrying more information (greater numbers of bits) require higher energy to send, but are sent less frequently than signal points carrying less information (fewer bits). At least some of the signal points carry information from the asynchronous secondary source in addition to information from the primary data source.

Figure 9:
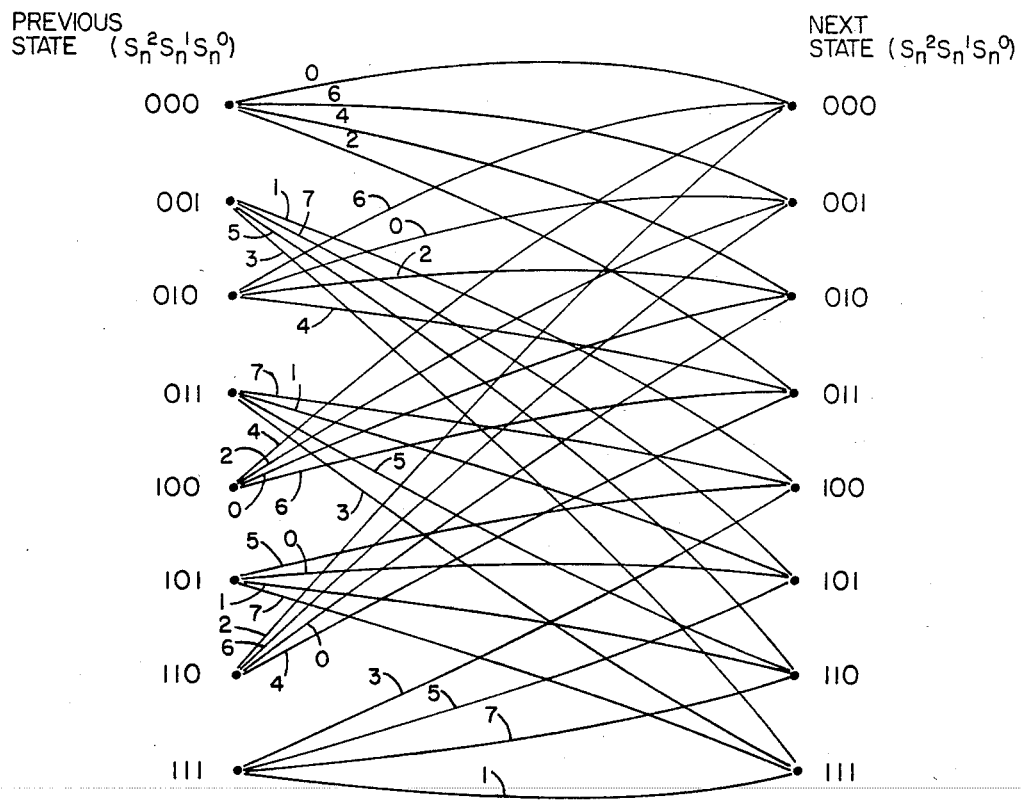
FIG. 9 is a trellis diagram for the convolutional encoder of FIG. 7.
Figure 8:
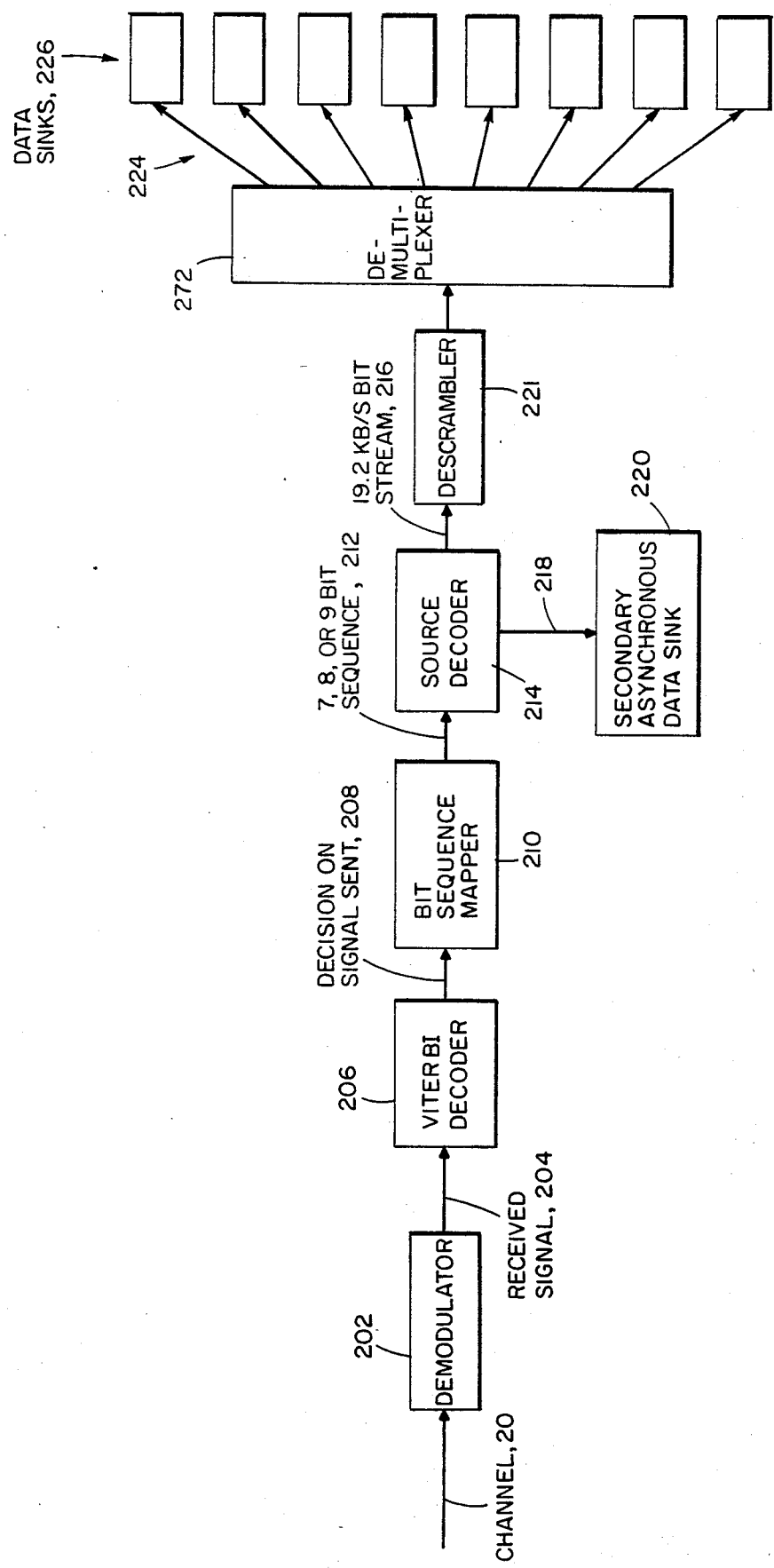
FIG. 8 is a block diagram of a receiver and data sinks.

Referring to FIG. 8, the receiver has demodulator 202 connected to receive the modulated, noise-distorted carrier over line 20 and to deliver a corresponding stream of received signals over line 204 to Viterbi decoder 206. Viterbi decoder 206, after a delay of 16 modulation intervals, decides which signal point was sent, by applying maximum likelihood sequence estimation to the stream of received signals, in a manner described in Csajka, and Ungerboeck, referred to above, and Forney, "The Viterbi Algorithm", Proceedings of the IEEE, Vol. 61, No. 3, March, 1973, incorporated herein by reference. The Viterbi decoder uses the coding data carried by each received signal to aid in determining the maximum likelihood sequence of sent signal points. The trellis state-transition diagram for the Viterbi decoder is shown in FIG. 9. Each branch is numbered to indicate the signal point subset corresponding to that branch.

The decision of which signal was sent is delivered over line 208 to bit sequence mapper which uses the reverse of the process discussed above for signal point processor 28 in the transmitter, to convert the recovered signal point into a sequence of 7, 8, or 9 bits which are delivered over line 212 to source decoder 214.

Source decoder 214 operates (in a manner described below) to produce a bit stream on line 216 at a rate of 19.2 kilobits per second, and an asynchronous stream of bits over line 218 to secondary asynchronous data sink 220, which uses the control information represented by the bits it receives.

The 19.2 kilobit per second stream is received through descrambler 224 by demultiplexer 222 which breaks it up into bits to be sent over lines 224 to eight data sinks 226.

Figures 10, 11:
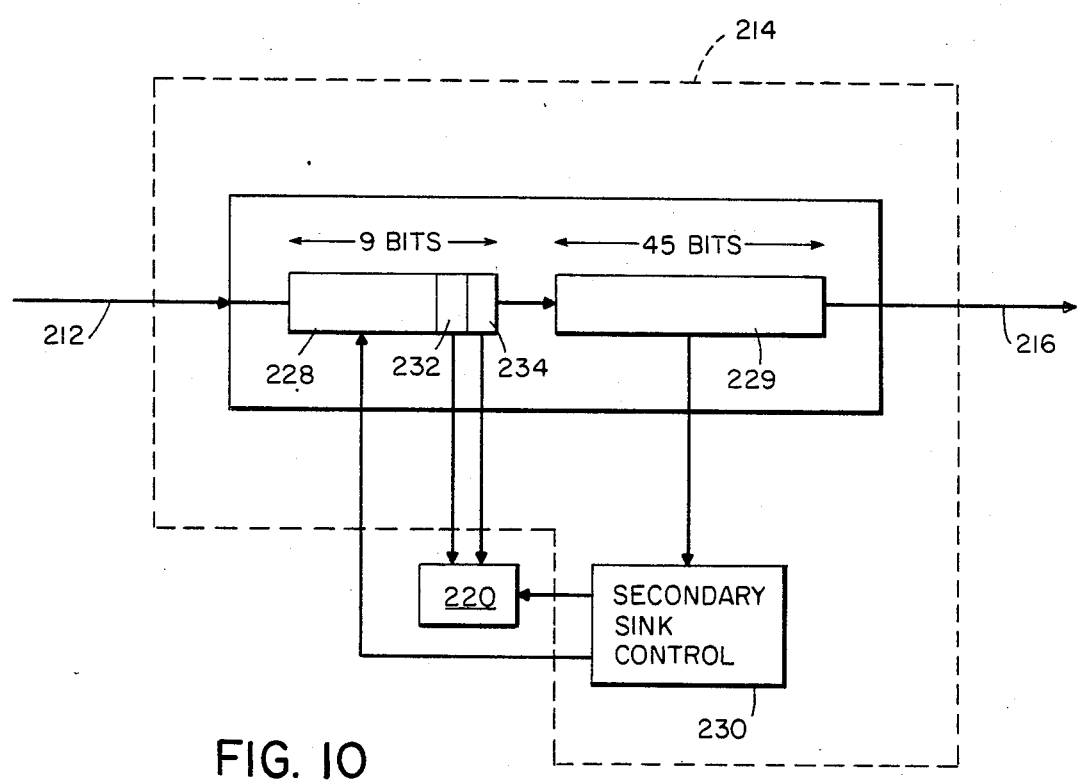
FIG. 10 is a block diagram of the source decoder of FIG. 9.
FIG. 11 is a table showing buffer length information for the buffer of FIG. 10 for successive modulation intervals.

Referring to FIG. 10, source decoder 214 includes a 9-bit long FIFO buffer 228 connected in series with a 45-bit long FIFO buffer 229.

Before the first modulation interval, buffer 229 is filled with 40 dummy bits. In the first five modulation intervals, only dummy bits are delivered from the end of buffer 229 to line 216, in the sixth interval no bits are delivered from the end of buffer 229 to line 216, and in each of the next fifteen intervals, eight bits are delivered to line 216. Then the sixteen-interval cycle repeats.

In each modulation interval, the 7, 8, or 9 bits coming in over line 212 are loaded into the buffer 228 and moved as far right as possible in buffer 228.

In some intervals, buffer 228 will hold one or two bits which carry control information from secondary source 26 which must be routed from cells 232, 234 (the final two cells in buffer 228) to secondary sink 220. Following removal of the control bits, the remaining bits in buffer 228 are shifted into buffer 229.

It is also necessary to remove bits from buffer 228 at a rate which parallels the stockpiling of bits in transmitter buffer 70. For example, at the end of the sixteenth interval this number is 39 which corresponds to there being at least 1 bit in the transmitter buffer 70 at the end of its sixteenth modulation interval. The number of bits (0, 1, or 2) to be routed to sink 220 in each interval is determined by buffer control 230, based on sensing the number of bits in buffer 229, and comparing that number with a maximum desired number (reflected on FIG. 11). If there are one or two excess bits in buffer 229 beyond the maximum desired number, then in the next interval the bit in cell 234 or the two bits in the cells 234, 232 are routed to sink 220.

Synchronization errors can occur when the number of bits in the received signal is either greater or fewer than the number of bits sent. Because there are different numbers of bits associated with the signal points in different regions of the constellation, a decoding error between regions will produce such a synchronization error. For example, if the decoder incorrectly decides that an outer region signal point (implying 9 bits) was sent when in fact a middle region signal point (implying 8 bits) was sent, there will be a one-bit synchronization error in subsequent modulation intervals.

The source coder and source decoder together provide an automatic resynchronization capability. If too many bits are received in a modulation interval, the receiver will by virtue of the operation of its buffer, mistakenly infer that the transmitter's buffer size is one bit shorter than it actually is. When the transmitter buffer reaches the minimum needed, the receiver will infer that the transmitter buffer has one fewer than needed and that therefore the transmitter is then forcing in a bit from the secondary source. Accordingly, the receiver will mistakenly feed a bit from the buffer to the secondary sink in the next interval, thus putting the receiver buffer once again in synchronization with the transmitter buffer. A similar sequence occurs if too few bits are received in a modulation interval, with resynchronization occurring when the transmitter buffer size dips one below the minimum needed. Here the transmitter will insert a bit from the secondary source, but the receiver believing the transmitter buffer to be one bit longer than it actually is will not be aware of this insertion and will keep the secondary channel bit in the information data stream, thus reestablishing synchronization.

Because resynchronization occurs only when the transmit buffer reaches its minimum needed number of bits for the end of a given interval it is desirable (in order to accomplish rapid resynchronization) to have bits entered into buffer 70 over line 12 at a rate considerably slower than the rate at which they are emptied over lines 26, 30. This desirable difference in rates produces shortfalls in the number of bits in the buffer which must be made up in part from the secondary source 26. The greater the probability of sending an outer or middle region point, the more frequently the transmitter buffer will be emptied, and the more quickly resynchronization will occur. Since higher probabilities of outer or middle region points means higher average energy, it is apparent that there is a trade-off between average energy and average delay before resynchronization. Simulations have shown that about $\frac{1}{4}$ to $\frac{1}{3}$ of all errors will involve loss of synchronization, and the average number of modulation interval errors before resynchronization is 7 to 8 resulting in an average of 2 or 3 extra errors due to synchronization loss per modulation interval error.

In order to reduce the resynchronization delay to an acceptable length, it may be necessary to get secondary source bits at times when the secondary source has no bits to deliver. By giving all of those additional bits the arbitrary value zero and by putting them in the most significant bit position as explained above, the signal points chosen in intervals when the secondary source has no information to send are inner region points (requiring less energy to send), thus saving energy. Thus, the relative probability of selection of an inner region point is higher for groups containing a bit of this prespecified arbitrary value than for groups containing an additional bit not having the arbitrary value. If one views the inner region as an inner collection of points, and the middle and outer regions as an outer collection of points, then each signal point drawn on the basis of a prespecified arbitrary value bit has a greater relative probability of being in the inner collection than does a signal point chosen on the basis of an additional bit provided by the secondary source.

If we consider the stream of bits needed from the secondary source as a secondary channel, that channel is thus underutilized, but the underutilization produces a saving in energy. The lower the utilization, the greater the power saving. Where $p = \frac{1}{4}$ is the probability of making a signal point selection from the outer region, the capacity of the secondary channel is 640 bits per second. At a utilization rate of 0.3, the secondary channel capacity is reduced to 441 bits/second of which 132=(0.3×441) are from the secondary source, and 309 are arbitrary zeros. Note that the secondary channel capacity decreases with decreasing utilization because 7-bit modulation intervals are more frequent, which lowers the probability of transmitter buffer 20 reaching its minimum state.

The power saving due to lower utilization may be up to 0.38 db (for p=¼ at 0 utilization) and is 0.30 db (at 0.3 utilization).

The choice of p (the probability of a signal point selection being made in the outer region or the middle region) will affect not only the length of delay to accomplish resynchronization, but also the secondary channel capacity and the average power saving. In general, larger values of p will produce faster resynchronization and higher secondary channel capacity but at a cost of lower power savings. The decibel gain from saving and the average resynchronization delay may be traded off. The same secondary channel capacity can be obtained with a larger p and a lower utilization rate or a smaller p and a higher utilization rate. A choice of p other than ¼ would require restructuring the constellation and the transmitter and receiver operation following the principles involved in the preferred embodiment. The constellation size is determined by the overall information rate and the value of p.

The combined effects of the convolutional coding and source coding produce a coding gain over a theoretical uncoded modulation system sending 7½ bits per modulation interval. Forney, U.S. Ser. No. 485,069 file date Apr. 14, 1983, shows a block code for sending N+½ bits per modulation interval (N an integer) at a cost in average power of 1.5 db over transmitting N bits per modulation interval (using standard square or cross-shaped constellation).

The coding gain due to convolutional coding and source coding in the present preferred embodiment can be obtained from the expressions for error probability for each of the uncoded and coded systems each using rectangular signal constellations:

$$\text{Uncoded at 7.5 Bits per Modulation Interval} \quad P_s = 4Q\left(\sqrt{\frac{2}{a}} \, 10^{SNR/20}\right), \, a = 116$$

$$\text{Preferred Embodiment} \quad P_s = 16Q\left(\sqrt{\frac{10}{a}} \, 10^{SNR/20}\right), \, \begin{array}{l} a = 226 \text{ at full} \\ \text{secondary channel} \\ \text{utilization } (a = 211 \\ \text{at 0.3 utilization)} \end{array}$$

where a is the average transmit power in each case, the closest distance between signal points is 2, SNR is the signal-to-noise ratio in db, $P_s$ is the error probability, Q(.) is the error function, and the coefficient on the Q function is the multiplicity of nearest points or error events.

Ignoring the effect of the coefficient, the coding gain is obtained by taking the difference in SNR's needed to make the error probabilities in the two cases equal.

In the range of error probabilities of interest, the effect of the Q function coefficient is to reduce the gain by approximately 0.2 db for each doubling of the coefficient. The factor of 4 difference in coefficients then reduces the gain by about 0.4 db. The combined coding gain due to convolutional and source coding is then.

$$20 \log \left( \frac{\sqrt{\frac{10}{226}}}{\sqrt{\frac{2}{116}}} \right) - 0.4 \text{ db} = 3.7 \text{ db}$$

at full secondary channel utilization (640 bits per second) and $$20 \log \left( \frac{\sqrt{\frac{10}{211}}}{\sqrt{\frac{2}{116}}} \right) - 0.4 \text{ db} = 4.0 \text{ db}$$

at 0.3 utilization (132 bits per second).

Other Embodiments

Other embodiments are within the following claims, e.g., the fractional number of bits sent per modulation interval may be other than ½; and the overall bit rate can be other than 19,200 bits per second.

I claim:

1. Apparatus for sending bits of information over a band-limited channel by modulating a carrier in accordance with a sequence of signal points drawn from a constellation of available signal points, said apparatus comprising
    circuitry for sampling a stream of said information bits from a data source in a predetermined sequence of bit time intervals, and for accumulating groups of said information bits for encoding into said signal points, different said groups having different numbers of said information bits, and
    an encoder for encoding at least the bits of each said group into at least one said signal point drawn from said constellation, said encoder being arranged to draw different said available signal points with different probabilities.

2. Apparatus for sending bits of information over a band-limited channel by modulating a carrier in accordance with a sequence of signal points drawn from a constellation of available signal points, said apparatus comprising
    a buffer for accepting said information bits in a predetermined order, and for delivering groups of said information bits in a predetermined order, different said groups having different numbers of said information bits, and
    an encoder for encoding at least the bits of each said group into at least one said signal point drawn from said constellation, said encoder being arranged to draw different said available signal points with different probabilities.

3. Apparatus for sending bits of information over a band-limited channel by modulating a carrier in accordance with a sequence of signal points drawn from a constellation of available signal points, said apparatus comprising
    circuitry for accumulating groups of said information bits from a data source and adding further bits to at least some of said groups, said circuitry being arranged to accumulate different numbers of said information bits in different said groups, and an encoder for encoding each said group and its further bits into at least one said signal point drawn from said constellation, said encoder being arranged to draw different said available signal points with different probabilities.

4. The apparatus of claim 3 wherein said further bits include bits of coding data used at a receiver to aid in determining which sequence of signal points was sent.

5. The apparatus of claim 4 wherein said coding data is added to every said group.

6. The apparatus of claim 3 wherein said circuitry is arranged to accumulate different aggregate numbers of said information bits and further bits in different said groups.

7. The apparatus of claim 1, 2, or 3 further comprising a secondary source of additional bits, and wherein said circuitry is arranged to accumulate information bits from said data source for inclusion in each said group, and to accumulate at least one additional bit from said secondary source for inclusion in at least some of said groups.

8. The apparatus of claim 7 wherein signal points corresponding to groups having fewer numbers of bits have a higher probability of being sent than at least some signal points corresponding to groups having greater numbers of bits.

9. The apparatus of claim 7 wherein at least some said additional bits accumulated from said secondary source comprise control information for use by said receiver.

10. The apparatus of claim 7 wherein said circuitry is arranged to accumulate from said secondary source bits having prespecified arbitrary values at times when bits are needed from said secondary source and said secondary source has no non-arbitrary bits to deliver.

11. The apparatus of claim 1, 2, or 3 wherein said different probabilities have a non-uniform distribution as a function of distance from the origin in said constellation.

12. The apparatus of claim 11 wherein said function is a step-function represented by a plurality of concentric regions of signal points on said constellation, each region being centered on the origin, the probability of selection of each signal point in one said region being the same as for any other signal point in said region but smaller than for any signal point in another region which is farther from the origin than said one region.

13. The apparatus of claim 12 wherein there are three said regions and the probability of selecting a particular signal point from each said region is half as great as the probability of selecting a particular signal point from the next closer region to the origin.

14. The apparatus of claim 13 wherein the respective probabilities of said signal point selections being in said three regions are $\frac{1}{2}$, $\frac{1}{4}$, and $\frac{1}{4}$.

15. The apparatus of claim 14 wherein some said groups include at least one additional bit, the signal points of each said region correspond to said groups having a particular number of bits, and the groups corresponding to regions farther from the origin have more bits than groups corresponding to regions nearer the origin.

16. The apparatus of claim 15 wherein the groups corresponding to said regions respectively each have 7, 8, and 9 bits.

17. The apparatus of claim 12 wherein some said groups include at least one additional bit, and said receiver is connected to use the region in which a received signal falls to determine the number of bits in each said group.

18. The apparatus of claim 10 wherein said predetermined arbitrary bits are selected to yield signal points nearer the origin than the complementary values.

19. The apparatus of claim 1, 2, or 3 wherein said circuitry comprises a first-in, first-out buffer arranged to accumulate said information bits at an average input rate, and to deliver bits at an average output rate to said encoder, said average input rate being lower than said average output rate.

20. The apparatus of claim 19 wherein said average input rate is a non-integral number of bits per modulation interval.

21. The apparatus of claim 20 wherein said average input rate is $7\frac{1}{2}$ bits per modulation interval, and said average output rate is $7\frac{3}{4}$ bits per modulation interval.

22. The apparatus of claim 19, further comprising a secondary source of additional bits, and wherein said buffer comprises a succession of buffer cells arranged from an input end to an output end of said buffer, and said buffer is arranged to accumulate said additional bits directly into buffer cells located at the output end of said buffer.

23. The apparatus of claim 19 wherein said signal points are arranged in concentric regions centered on the origin of said constellation, and the number of bits in the group delivered by said buffer in a given modulation interval determines the region from which the signal point for that group is drawn.

24. The apparatus of claim 19 wherein said buffer further comprises buffer control circuitry for assuring that a predetermined minimum number of bits are held in said buffer immediately before each said modulation interval begins.

25. The apparatus of claim 19 wherein said buffer and said buffer control circuitry are connected so that no fewer than a minimum permissible number of bits can be in the buffer after said buffer delivers said bits in each modulation interval, and said average input and output rates are selected to assure that no more than said minimum permissible number is in said buffer after said delivery in enough said modulation intervals so that synchronization errors at said receiver will be corrected on average within a predetermined acceptable number of modulation intervals.

26. Apparatus for sending bits of information over a band-limited channel by modulating a carrier in accordance with a sequence of signal points drawn by an encoder from a constellation of available signal points, said encoder being arranged to draw each said signal point on the basis of a group of said information bits, different said groups corresponding to signal points at different distances from the origin of said constellation, said apparatus comprising a secondary source for normally providing additional bits to said encoder, said encoder being arranged so that each signal point selected on the basis of said additional bits from said secondary source has predetermined relative probabilities of being in an inner collection of said signal points nearer the origin compared with being in an outer collection of said signal points farther from the origin, and circuitry for providing an additional bit to said encoder when said secondary source has no additional bits to provide, said additional bits provided by said circuitry having an arbitrary value pre-selected so that each signal point drawn on the basis of such an arbitrary valued additional bit has a greater relative probability of being in said inner collection versus being in said outer collection than said predetermined relative probabilities with respect to an additional bit provided by said first source.

27. The apparatus of claim 26 wherein all signal points drawn on the basis of an additional bit having said arbitrary value are in said inner collection.

* * * * *